United States Patent
Sodano

(10) Patent No.: US 10,584,189 B2
(45) Date of Patent: Mar. 10, 2020

(54) FERROELECTRIC POLYMERS FROM DEHYDROFLUORINATED PVDF

(71) Applicant: The Regents of the University of Michigan, Ann Arbor, MI (US)

(72) Inventor: Henry A. Sodano, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 15/434,442

(22) Filed: Feb. 16, 2017

(65) Prior Publication Data

US 2018/0230249 A1 Aug. 16, 2018

(51) Int. Cl.
*C08F 8/26* (2006.01)
*H01L 41/45* (2013.01)
*H01L 41/193* (2006.01)

(52) U.S. Cl.
CPC .............. *C08F 8/26* (2013.01); *H01L 41/193* (2013.01); *H01L 41/45* (2013.01)

(58) Field of Classification Search
CPC .......... C08F 8/26; C08F 14/22; C08F 114/22; C08F 214/22; H01L 41/193; H01L 41/45
See application file for complete search history.

(56) References Cited

U.S. PATENT DOCUMENTS

| | | | | |
|---|---|---|---|---|
| 4,678,842 A | * | 7/1987 | Sandler | C08F 8/26 525/326.2 |
| 4,742,126 A | * | 5/1988 | Moggi | C08F 8/26 525/326.2 |
| 5,389,725 A | * | 2/1995 | Bando | C08L 27/12 525/146 |
| 5,922,493 A | * | 7/1999 | Humphrey, Jr. | H01M 2/0275 429/175 |
| 2009/0263671 A1 | | 10/2009 | Yao et al. | |
| 2013/0264912 A1 | | 10/2013 | Kwon et al. | |

FOREIGN PATENT DOCUMENTS

| | | |
|---|---|---|
| CN | 105968392 A | 9/2016 |
| EP | 0174838 A2 | 3/1986 |
| EP | 1966810 B1 | 1/2012 |
| KR | 20090030825 A | 3/2009 |
| KR | 20090030827 A | 3/2009 |

(Continued)

OTHER PUBLICATIONS

Künstler, Wolfgang; "Piezo- and Pyroelectric Properties of Dehydrofluorinated PVDF Films," 8th International Symposium on Electrets, IEEE, 1994, pp. 640-643.

(Continued)

*Primary Examiner* — Robert C Boyle
(74) *Attorney, Agent, or Firm* — Harness, Dickey & Pierce, P.L.C.

(57) ABSTRACT

A β-phase PVDF is prepared through a controllable dehydrofluorination under either a basic or high temperature condition. PVDF is degraded by losing hydrogen fluoride (HF) and either carbon-carbon double bonds form in the molecular backbone or single bonds form crosslinking the two polymer chains. These changes in structure influence the crystallization behavior of PVDF and therefore, influence the electrical properties by changing the arrangement of the dipoles.

23 Claims, 5 Drawing Sheets

(56) References Cited

FOREIGN PATENT DOCUMENTS

| KR | 101348902 B1 | 1/2014 |
| KR | 20140097875 A | 8/2014 |
| WO | WO-2015/128337 A1 | 9/2015 |

OTHER PUBLICATIONS

Tee, Benjamin C.-K., et al.; "A skin-inspired organic digital mechanoreceptor," Science, vol. 350, Issue 6258, Oct. 16, 2015, pp. 313-316.

International Search Report and Written Opinion for PCT/US2018/014476, dated Jul. 24, 2018; ISA/KR.

Ameduri, Bruno. From Vinylidene Fluoride (VDF) to the Applications of VDF-Containing Polymers and Copolymers: Recent Developments and Future Trends. Chemical Reviews. Apr. 9, 2009, vol. 109, No. 12, pp. 6632-6686.

Taguet, A. et al. Crosslinking of Vinylidene Fluoride-Containing Fluoropolymer. HAL archives-ouvertes.fr [online]. May 7, 2009. [retrieved on Jul. 9, 2018]. Retrieved from the Internet: <URL: http://hal.archieves-ouvertes.fr/hal-00381856/document>.

* cited by examiner

FERROELECTRIC POLYMERS FROM DEHYDROFLUORINATED PVDF

FIELD

The present disclosure relates to ferroelectric polymers and, more particularly, relates to ferroelectric polymers formed from dehydrofluorinated poly (vinylidene fluoride) PVDF.

BACKGROUND

This section provides background information related to the present disclosure which is not necessarily prior art. This section also provides a general summary of the disclosure, and is not a comprehensive disclosure of its full scope or all of its features.

The present invention concerns a material that displays piezoelectric and ferroelectric properties. Piezoelectricity refers to the accumulation of an electric charge due to the application of mechanical stress. These materials also exhibit the reverse effect: when subject to an electrical charge, they will undergo mechanical strain.

Ferroelectric materials contain a permanent dipole which allows them to maintain a polar electric field when they are not subjected to an external field. All ferroelectric materials display piezoelectricity. There is interest in using polymers to create such materials due to the fact that polymers are lightweight, low cost, and relatively easy to process as compared to intermetallic compounds. Piezoelectric polymers, such as poly (vinylidene fluoride) (PVDF) and its copolymers, have the potential to achieve large strains and high working energy density under external electrical fields, which is very promising for biomimetic actuators and artificial muscle technologies.

Poly (vinylidene fluoride) (PVDF) is a polymer that shows promise as a ferroelectric materials. In addition to an amorphous phase, PVDF can crystallize into multiple phases with different chain conformations known as α, β, and γ-phase. Only the β-phase has strong ferroelectric and piezoelectric properties because of its planar conformation and high dipole density.

Previous methods to produce ferroelectric PVDF rely on combinations of annealing, controlled solvent evaporation, and uni-axial stretching of a sample. These methods yield a final product that lacks thermal stability or contains an insufficient proportion of the β-phase.

The ferroelectric β-phase has only been obtained through use of a drawing process (typically 300-400% elongation). Thus only thin films can be effectively produced, placing limits on the potential application space and transducer design.

SUMMARY

Here, we introduce a versatile method to prepare stable β-phase PVDF through dehydrofluorination, which provides the highest piezoelectricity and ferroelectricity among all the phases of PVDF. A prepared β-phase PVDF is used to fabricate a thin film actuator, which exhibits high ferroelectricity (remnant polarization up to 6.31±0.15 μC/cm$^2$) and giant electromechanical coupling (piezoelectric strain coefficient ($d_{33}$) up to −71.84±1.73 pm/V). A superior piezoelectric voltage coefficient ($g_{33}$) of 0.41 Vm/N is calculated from such results and an exceptionally large piezoelectric strain (up to 3%) is observed from the PVDF actuator at room temperature under an oscillating electric field.

These properties of the dehydrofluorinated β-phase PVDF surpass those of more expensive PVDF copolymers currently used in piezoelectric actuators, indicating its great potential for application in the fabrication of high performance and low cost biomedical and mechanical actuators.

The present invention is a dehydrofluorination (DHF) process that induces defects into the PVDF polymer such that double bonds and crosslinks are formed. These defects have been found to preferentially induce crystallization in the β-phase without the need for drawing. The production of as cast PVDF films with high β-phase and piezoelectric coupling has not been demonstrated in the literature and the present invention is the first to show that the DHF process can produce greatly increased piezoelectricity.

This value of the $d_{33}$ is also higher than any value reported in the literature for a piezoelectric polymer film and the g-coefficient is the highest of any material ever reported. The process allows 3D printing, injection molding, and spin coating of the polymer, all of which could never be applied for ferroelectric PVDF in the past.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

Electroactive polymers that can generate large mechanical strains in response to external electric fields have attracted a great deal of interest in recent years. One of the major goals of electroactive materials research is to develop biomimetic actuators that can generate large motions with high responding speed and precision and high strain energy density to produce large forces, to achieve the functions comparable to natural muscles. Many newly developed electroactive polymers have been reported to exhibit large strain at levels far above those from traditional inorganic piezoelectric materials. Some of these polymers even exhibit a much higher stain energy density than that of piezoelectric ceramics. Combining their renowned excellent properties including lightweight, ease of processing, and low cost, such polymers with stimuli-responsive abilities are used in many applications such as artificial muscles, smart skins, sensors, actuators, E-textiles, energy harvesters, MEMS devices and micro-fluid systems.

Figure 1A:
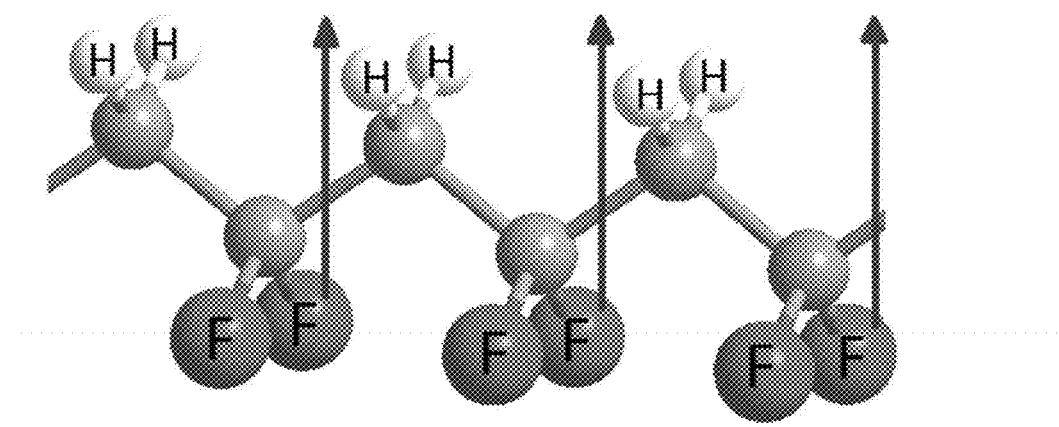
FIG. 1A illustrates fully aligned dipoles (arrows indicating the dipole direction) in β-phase PVDF enabling higher piezoelectricity.

Among these polymers, piezoelectric polymers such as PVDF and its copolymers have been studied for a few decades for electromechanical device applications. As a piezoelectric material, PVDF is able to respond to external electric fields with high precision and speed, and generate relatively high stresses. However, the piezoelectric properties of PVDF are limited by its crystallization behavior because PVDF is a semi-crystalline polymer with multiple phases, including a paraelectric α-phase, a weak piezoelectric γ-phase, a strong piezoelectric β-phase, and the amorphous phase. Among these phases, the most desirable phase is the β-phase because it has an all-trans planar chain conformation where every repeat unit functions as an aligned dipole. This leads to the largest number of aligned permanent dipoles among all PVDF phases (see FIG. 1A) and results in better ferroelectric, piezoelectric, and pyroelectric properties.

Previously reported methods achieve high β-phase content in PVDF with an enhanced ferroelectricity through uni-axial stretching, controlling the evaporation rate and temperature, and heating processes such as annealing. However, the β-phase PVDF achieved from these methods, especially for the most common mechanical stretching method, are still limited to an insufficient β-phase amount and lack of thermo-stability. This limited β-phase content restricts PVDF from fully developing and utilizing its potential as a piezoelectric material. This shortcoming leads to a low strain level and strain energy density, which severely limits its prospect in actuator application.

In one embodiment, a method for synthesizing a piezoelectric material involves dissolving a starting fluoropolymer in a solvent with a weak base and then reacting the weak base and the starting fluoropolymer for a time sufficient to dehydrofluorinate the fluoropolymer and form a reaction mixture. Thereafter, the method involves recovering the dehydrofluorinated fluoropolymer as a solid from the reaction mixture. As a result of the method, the fluoropolymer in the reaction mixture has a higher content of β-phase than the starting fluoropolymer. In various embodiments, the starting fluoropolymer comprises poly (vinylidene fluoride) or a copolymer of vinylidene fluoride. In various embodiments, the weak base is a weak organic base, such as a primary or a secondary amine. For example, the weak organic base is selected from $C_{1-6}$ monoamines and $C_{1-6}$ diamines. In the method, the solution contains a solvent as well as a fluoropolymer. In various embodiments, the solvent is selected from N-methyl pyrrolidone (NMP), dimethylsulfoxide (DMSO), N,N-dimethylformamide (DMF), methyl ethyl ketone (MEK), tetrahydrofuran (THF), and N,N-dimethylacetamide (DMAc). The vinylidene fluoride copolymer can be, in non-limiting fashion, a copolymer of vinylidene fluoride and trifluoroethylene (TrFE).

In another embodiment, the starting fluoropolymer comprises a copolymer of vinylidene fluoride, trifluoroethylene, and either hexafluoropropylene (HFP) or chorotrifluoroethylene (CTFE). In various embodiments, the reaction is carried out at a temperature of 0° to 50° C., or at approximately room temperature. After the reaction is complete, the dehydrofluorinated fluoropolymer can be recovered as a solid from the reaction mixture, or the reaction mixture can be used as a solution for casting films. in various embodiments, recovering the dehydrofluorinated as a solid from the reaction mixture comprises precipitating the solid fluoropolymer from the solution, or casting the reaction mixture and removing the solvent from the solution.

In another embodiment, a method for making a piezoelectric solid polymer material is provided that does not involve stretching the polymer material. The method includes the steps of reacting a starting polymer in a solution with a weak base such as an organic base to make a polymeric reaction product and recovering the polymeric reaction product from the solution. Identities of the starting polymer are given in the description of the embodiments above and further herein, and include poly(vinylidene fluoride) or a copolymer of vinylidene fluoride. The polymeric reaction product recovered from the solution is characterized by a piezoelectric strain coefficient $d_{33}$ that is higher than the piezoelectric strain coefficient of fluoropolymers obtained to date. In various embodiments, the piezoelectric strain coefficient $d_{33}$ is higher than 25 pm/V, higher than 30 pm/V, or higher than 40 pm/V. Here, higher than 25 pm/V and similar terms mean that the strain coefficient is more negative than −25 pm/V and so on.

In some embodiments, the method further comprises drawing the polymeric reaction product.

In another embodiment, a method for making a stable β-phase poly (vinylidene fluoride) (PVDF), with or without stretching or drawing, involves reacting PVDF in a solvent with a weak base like an amine and recovering β-phase PVDF from the solution. Here and in other embodiments, the amine is selected, for example, from primary amines, secondary amines, monoamines, and diamines.

Conveniently, the amine is chosen so as to be soluble in the reaction solvents so as to make clean up easy. In various embodiments, the amine is soluble or miscible in water. Reaction is carried out at mild temperatures such as at 100° C. or less. In various embodiments, the temperature of reaction is 50° C. or less and is advantageously carried out at about room temperature or about 20° C. to 30° C. Conveniently, in various embodiments, the polymer is recovered from the solution by precipitation with water. Alternatively, the reaction mixture is ready for direct casting or dispensing.

The above embodiments and others described herein are characterized in various ways by the choice of fluoropolymer used, by the identity of the weak base, by the reaction conditions of time and temperature, by the solvent used, by the ferroelectric values of the dehydrofluorinated polymers (for example $d_{33}$) obtained, by the conditions of optional annealing steps, and other ways. It is to be understood that the various embodiments described herein can be provided with various values of all of the above parameters to describe other embodiments not otherwise explicitly provided. A description of the various parameters of the invention follows.

Fluoropolymer

The fluoropolymer is selected from known piezoelectric fluoropolymers of the prior art. In one aspect, the fluoropolymer is a homopolymer of vinylidene fluoride or poly (vinylidene fluoride) (abbreviated as "PVDF"). In another embodiment, the fluoropolymer is selected as a copolymer containing vinylidene fluoride. This is referred to as a copolymer of VDF. Of particular interest is a copolymer of vinylidene fluoride and trifluoroethylene (TrFE). Among those of interest are copolymers of VDF and TrFE containing 20 mol %, 25 mol %, or about 30 mol % TrFE.

Terpolymers containing VDF are also useful. Examples include terpolymers of VDF and TrFE, plus additionally hexafluoropropylene (HFP). Another non-limiting example is a terpolymer containing VDF, TrFE, and chlorotrifluoroethylene (CTFE).

Other monomers can be copolymerized with VDF to make other piezoelectric polymers. The piezoelectric materials are characterized in that there is a so-called β-phase that has suitable piezoelectric properties. Until now, the β-phase of these fluoropolymers could only be reached by stretching the polymers in such a way as to obtain piezoelectric films. The fluoropolymers treated according to the current teachings, however, are not limited to the physical form of thin films and can be obtained without orienting or stretching the polymer films after the dehydrofluorination reaction.

Weak Organic Base

The most common weak organic bases useful in the current teachings are organic amines. In various embodiments, the amines are preferably primary or secondary amines and can be chosen from monoamines and diamines. In various embodiments, the organic amines are selected from those in the $C_{1-6}$ range. In various embodiments, the amines are water soluble or even miscible in water. A non-limiting example of the suitable organic amine is ethylene diamine.

Reaction Conditions

The dehydrofluorination reaction is carried out by contacting the fluoropolymer and the weak organic base at suitable concentrations for a suitable time and at a temperature sufficient to prepare a treated fluoropolymer that has an elevated content of β-phase and which has suitable physical properties. Advantageously, the reaction can be carried out at ambient or close to ambient conditions, such as at temperatures below 100° C. In various embodiments, the reaction is advantageously carried out at about room temperature, which can be taken as ranges of 10° to 50° C. or a range of 20° to 40° C. In other embodiments, the reaction is carried out at a temperature of 20° C. to 30° C., or at about 25° C.

Although not normally required, the reaction can even be carried out at temperatures below room temperature, such as in an ice bath at a temperature of approximately 0° C.

The time of reaction is taken as any time sufficient to increase the level of beta phase in the fluoropolymer. Specific examples of suitable times are given in the Examples and figures below. In general, reaction is carried out for an hour, a few hours, or up to about eight to twelve hours. Suitable reaction conditions are described in the working example.

Solvent

A suitable solvent is one that will dissolve the fluoropolymer and the weak base. Non-limiting examples include N-methylpyrrolidone (NMP), dimethyl sulfoxide (DMSO), dimethylformamide (DMF), dimethylacetamide (DMAc), tetrahydrofuran (THF), and acetone. A suitable solvent is further one that will precipitate the fluoropolymer from the solution by addition of a non-solvent such as water.

Ferroelectric Values of the Dehydro Fluorinated Polymers

The fluoropolymers made by the methods disclosed herein have high piezoelectric strain coefficients, $d_{33}$, compared to fluoropolymers in the prior art. The units of the piezoelectric strain coefficient $d_{33}$ are given equivalently as $10^{-12}$ C/N (coulombs of surface charge per Newton of surface strain) or as pm/V, or picometers per volt. Values of the coefficient are given as absolute values in units of pm/V. Thus, in various embodiments, polymers prepared by the disclosed methods have a coefficient $d_{33}$>30 pm/V, >35 pm/V, >40 pm/V, >45 pm/V, >50 pm/V, >60 pm/V, or >70 pm/V. If by convention the coefficient $d_{33}$ takes on a negative value, these values are understood as the absolute value of a negative $d_{33}$. It is also possible to characterize them as more negative than −30 pm/V, more negative than −35 pm/V, and so on. Any of those values can be the lower range of coefficients $d_{33}$. In various embodiments, the coefficient $d_{33}$ is <100 pm/V, <90 pm/V, or <80 pm/V, with a similar proviso for negative values. Any of these values can be the upper range of values obtained for strain coefficient $d_{33}$. In preferred embodiments, the coefficient $d_{33}$ obtained for the fluoropolymers is higher (or equivalently more negative) than those known in the prior art and which are made by different methods.

Optional Annealing

Optionally, annealing can be carried out. The annealing process is used to increase crystallinity of films or to increase the smoothness of samples to be used for doctor blading and spin coating. Other processing methods, for example, extrusion and 3D printing, do not require the annealing step.

In a typical annealing process, a prepared thin film is placed in an oven and heated up to 200° C. Once it reaches 200° C., the temperature of the oven is slowly decreased to room temperature over a suitably long time period, such as five hours, for example, with a rate of about 0.5° C. per minute.

EXAMPLES

Figure 1B:
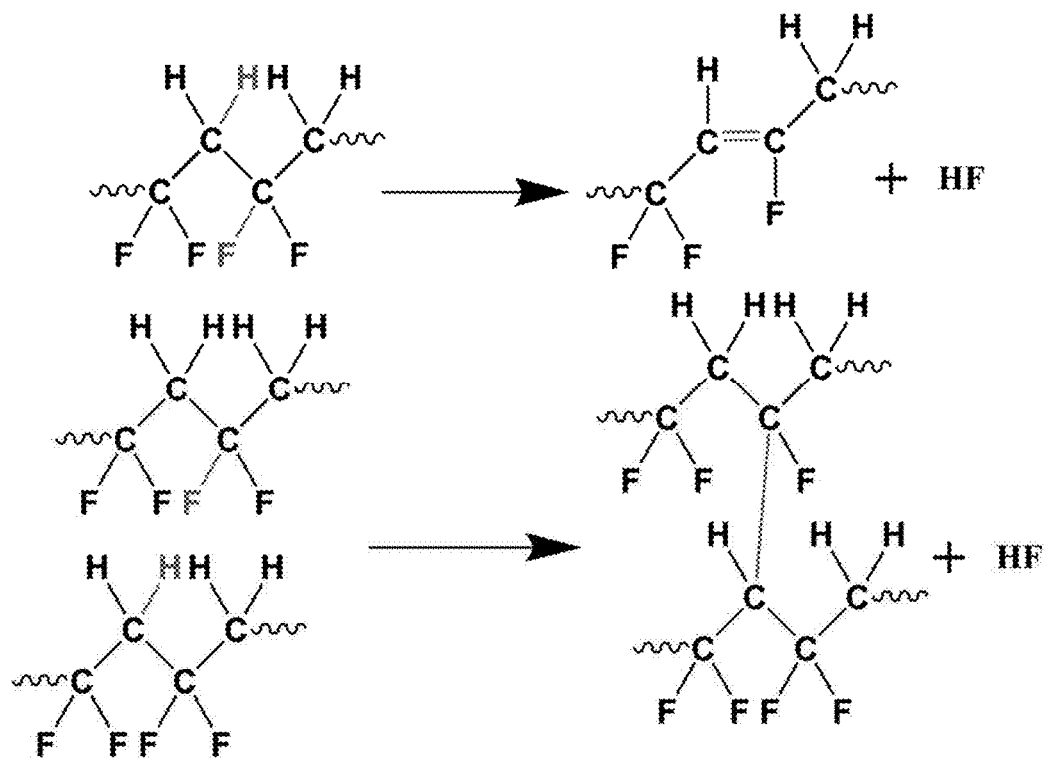
FIG. 1B illustrates the mechanism of PVDF dehydrofluorination through the formation of double bonds and the crosslinking of the polymer.

The present teachings show how a high quality β-phase PVDF is prepared through a controllable dehydrofluorination method. Although the invention is not limited to a theory or a mechanism of action, it is believed that a dehydrofluorination reaction occurs when PVDF is under either a basic or high temperature condition. Through the dehydrofluorination reaction, PVDF is degraded by losing hydrogen fluoride (HF) and either carbon-carbon double bonds form in the molecular backbone or single bonds form crosslinking the two polymer chains, as shown in FIG. 1B. These changes in structure in turn influence the crystallization behavior of PVDF and therefore, influence the electrical properties by changing the dipoles arrangement. The β-phase content in the slightly dehydrofluorinated PVDF increases because the stiff and planar double bonds in the polymer backbones induce a more planar conformation (β-phase) of PVDF. However, in the case of over-dehydrofluorinated PVDF, an increase of undesirable crosslinks and excess degradation will occur, interrupting the crystallinity of PVDF and reducing the electrical properties. Thus, by controlling the extent of dehydrofluorination, a stable β-phase PVDF with unprecedented electrical properties can be obtained.

Tests of thin films show that this method leads to the following properties, all of which are large for a polymeric material: Remnant polarization of 6.31 μC/cm², piezoelectric strain coefficient ($d_{33}$) of −71.84 pm/V, and piezoelectric strain of 3%.

In previous research, strong inorganic bases, such as sodium hydroxide and potassium hydroxide, were used to induce fast dehydrofluorination, which caused over-reaction and reduced the electric properties. The action of strong bases can be lessened or controlled by carrying out the reaction for short times or by reducing the temperature of reaction, and the teachings include reacting with strong base such as NaOH or KOH at reduced temperatures, even at room temperature or lower, such as 0° C. (ice bath). In other embodiments, instead of using a strong base, the present teachings provide for employing a weak organic base for better control. In a non-limiting embodiment, a weak base such as ethylene diamine (EDA) is added to a PVDF/N,N'-dimethylformamide (DMF) solution to slowly induce the dehydrofluorination of PVDF. The extent of dehydrofluorination is controlled by the reaction time and temperature. After treating with the weak organic base, smooth dehydrofluorinated PVDF thin films can be readily made by doctor blading, spin coating, 3D printing or injection molding methods, followed by a high temperature annealing process to increase crystallinity.

From these PVDF thin films, experimental evidence shows that the β-phase is increased and becomes the dominant phase through the dehydrofluorination process. Furthermore, we present experimental results showing that these dehydrofluorinated PVDF thin films achieve high ferroelectricity and giant piezoelectric properties. A piezoelectric strain coefficient $d_{33}$ larger than any previously reported PVDF is achieved and a large piezoelectric strain up to 3% is observed. These distinct features of this dehydrofluorinated PVDF promise their broad applications in transducers, actuators and energy harvesting devices.

Figure 2A:
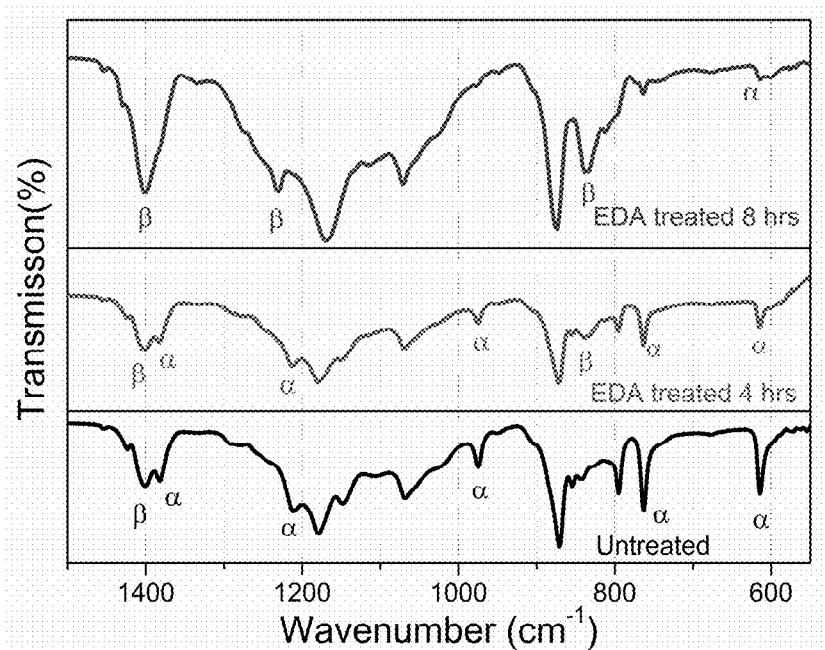
FIG. 2A shows FTIR spectra.

To experimentally prove formation of the β-phase PVDF through dehydrofluorination, Fourier-transform infrared spectroscopy (FTIR) and X-ray diffraction (XRD) measurements are performed. FTIR spectra of untreated and dehydrofluorinated PVDF of different reaction times are shown in FIG. 2A. This shows that the paraelectric α-phase is dominant in the untreated PVDF film, but coexists with a very small amount of β-phase and γ-phase. However, dehydrofluorination slowly induces the β-phase and thus, induces ferroelectric properties to the treated PVDF.

Figure 2B:
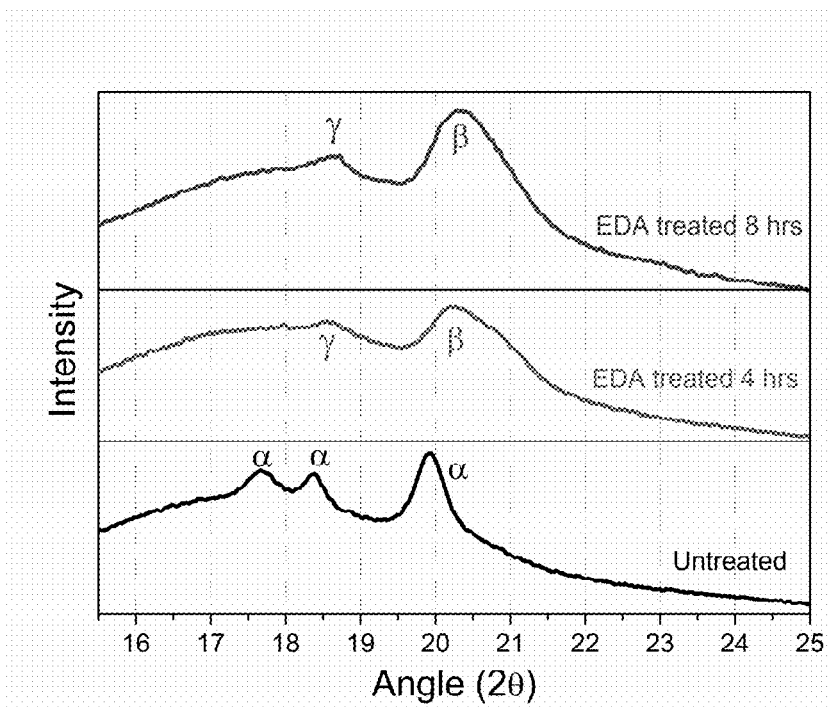
FIG. 2B illustrates XRD patterns of PVDF before and after different time of dehydrofluorination.

As shown in FIG. 2A, after four hours of dehydrofluorination, the composition of PVDF becomes a mixture of α-phase and β-phase where the characteristic bands of α-phase become weaker and the bands of β-phase become stronger. After eight hours of dehydrofluorination, the PVDF is dominated by the β-phase, with only a very small amount of the α-phase and the γ-phase remaining. This phase identification is confirmed by XRD measurements on the same thin film samples (FIG. 2B). The peaks at 17.6° and 19.9°, which can be ascribed as the α-phase, are dominating in the pattern of untreated PVDF samples but disappear in the XRD patterns of the dehydrofluorinated PVDF samples. It is also observed that the intensities of the peak at 20.3°, representing the β-phase, and the peak at 18.6°, representing both β-phase and γ-phase because of their similar crystal structure, are both increasing along with increasing dehydrofluorination time.

Such results indicate that, through dehydrofluorination, the β-phase appears and increases as reaction time increases, accompanied with a decrease of the α-phase, proving that the β-phase is formed under the influences of dehydrofluorination. In the case of prolonged reaction time, the β-phase composition remained dominant in the XRD patterns and the FTIR spectra, indicating that extra reaction time (more than 8 hours) is unnecessary.

Figure 3A:
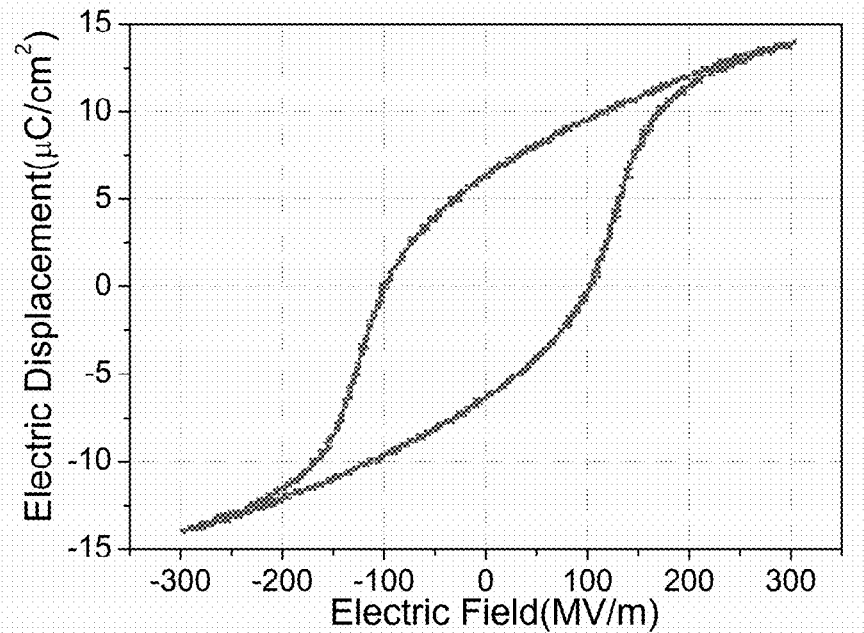
FIG. 3A illustrates polarization versus electrical fields plots (hysteresis loops) of PVDF films treated for 8 hours.

In order to measure the ferroelectric properties of dehydrofluorinated PVDF, a Sawyer-Tower circuit is used. The polarization versus electrical field relationship is obtained by applying a sinusoidal voltage signal with a frequency of 100 Hz and a maximum amplitude of 300 MV/m onto the circuit. As shown in FIG. 3A, dehydrofluorinated PVDF sample with eight hours reaction time exhibits a typical ferroelectric polarization hysteresis loop with a maximum remnant polarization of 6.31±0.15 µC/cm² (polarization at field E=0) and a coercive field of 105±5 MV/m (field at polarization P=0). The ferroelectricity obtained from the present invention's PVDF thin films surpassed that of many previously reported PVDF and is even comparable to that of the ferroelectric enhanced PVDF trifluoroethylene copolymers, or P(VDF-TrFE).

Figure 3B:
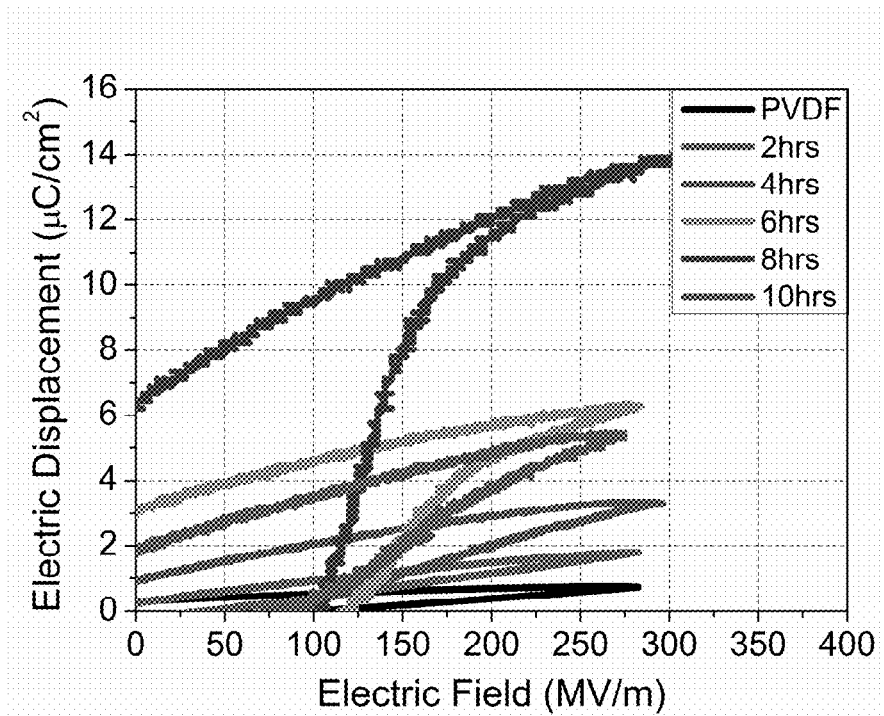
FIG. 3B illustrates polarization versus electrical fields plots (hysteresis loops) of PVDF films treated for 2-10 hours and untreated PVDF.

FIG. 3B shows the hysteresis loops of pristine PVDF and dehydrofluorinated PVDF films under a sinusoidal electric field with a maximum amplitude of 300 MV/m. Their remnant polarizations and coercive fields are shown as well in FIG. 3C. This behavior demonstrates that the remnant polarizations of EDA treated PVDF films can be in the range of 0.29±0.08 to 6.31±0.15 µC/cm², increasing significantly with longer treatment time. Meanwhile, the remnant polarization of the untreated α-phase PVDF film is only 0.25±0.05 µC/cm² and does not display any ferroelectric properties.

As mentioned above, the β-phase has better ferroelectric performance than the α-phase and the γ-phase. Larger ferroelectric domains exist in the thin film because the planar conformation of the β-phase allows the formation of more aligned permanent dipoles in the same direction. This increasing remnant polarization also indicates that the percentage of the β-phase rises as treatment time increases. However, it should also be noted that ferroelectricity decreased significantly in the PVDF film when treated with EDA for longer than 8 hours. For instance, the remnant polarization in the PVDF sample treated for ten hours is measured to only be 1.95±0.11 µC/cm². This decrease is caused by the increase in crosslinks formed by the over-reacted dehydrofluorination since a high degree of cross-linking will lead to less crystallinity, thus decreasing the dipole domain size.

Figure 3C:
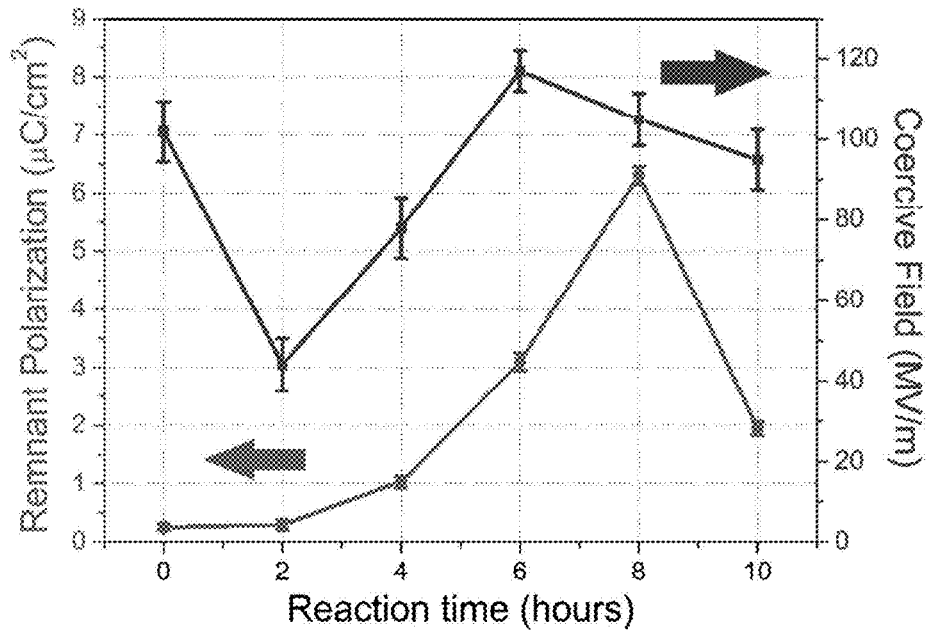
FIG. 3C illustrates their remnant polarization and coercive field values.

FIG. 3C shows that the coercive field decreases below 50 MV/m when PVDF is treated with EDA for a short time, such as two hours (coercive field is 44±7 MV/m). However, the coercive field increases with an increasing treatment time and eventually increases to around 100 MV/m. The reason why the coercivity in the lightly dehydrofluorinated PVDF decreases is speculated to be because the coexistence of different phases (observed in the FTIR and the XRD results) induces more grain boundaries. This measurement reveals the high ferroelectric properties in the dehydrofluorinated PVDF. Furthermore, this indicates the optimal reaction time of dehydrofluorination in inducing the β-phase in PVDF, providing that EDA treated PVDF samples with a reaction time of eight hours has the highest content of effective β-phase thus has the highest ferroelectricity.

Figure 4A:
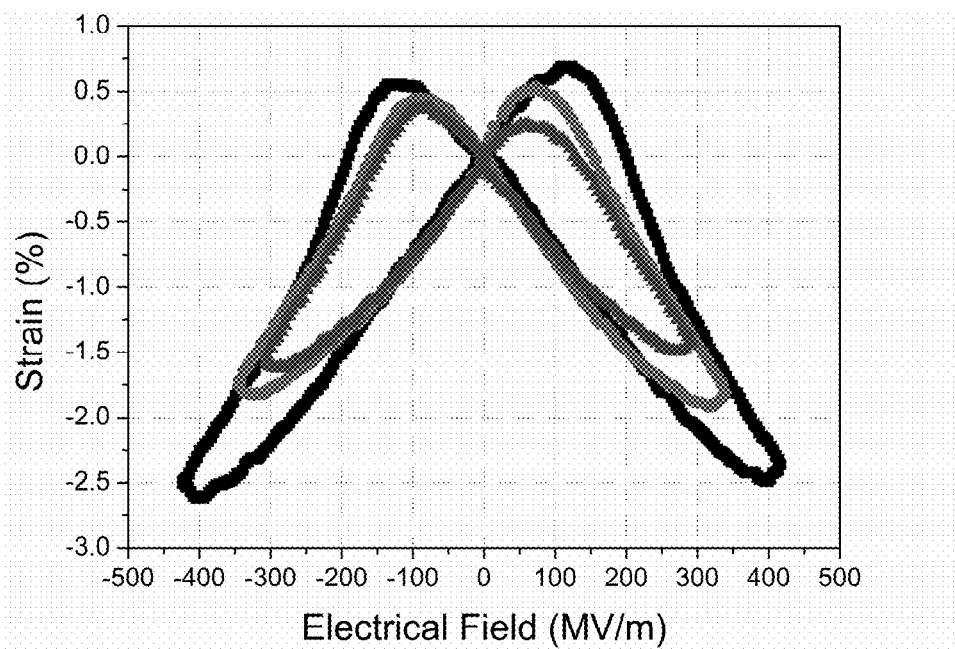
FIG. 4A shows strain versus electrical field plots (butterfly loop response).

A refined piezoelectric force microscopy (PFM) testing setup is performed to characterize the piezoelectric properties of the β-phase PVDF as an actuator material. Dehydrofluorinated PVDF is spin-coated onto a piece of gold coated silicon wafer, which serves as the bottom electrode. A thin film actuator is thus fabricated with a PVDF thickness of ~350 nm, where the thickness of the coated film is measured using a non-contact mode topography scan at a low scan speed. The PFM testing is performed using a Pt-coat conductive tip (40 N/m in force constant) on the film surface with an 1200 nN applied normal force, serving as the top PFM electrode. An AC voltage (1 Hz triangle wave) in range of 0.5 V~1.5 V is amplified by 200 times and applied through the top PFM electrode to measure piezoelectric properties under the high electrical fields. An AC signal frequency (17 kHz) on a lock-in amplifier is used to reduce low-frequency noise and drift near the cantilever resonance (325 kHz). The plots of strain versus bipolar electrical field from the β-phase PVDF thin film are shown in FIG. 4A and display a typical butterfly loop response, which is attributed to the nature of domain motion and piezoelectric properties of PVDF.

Figure 4B:
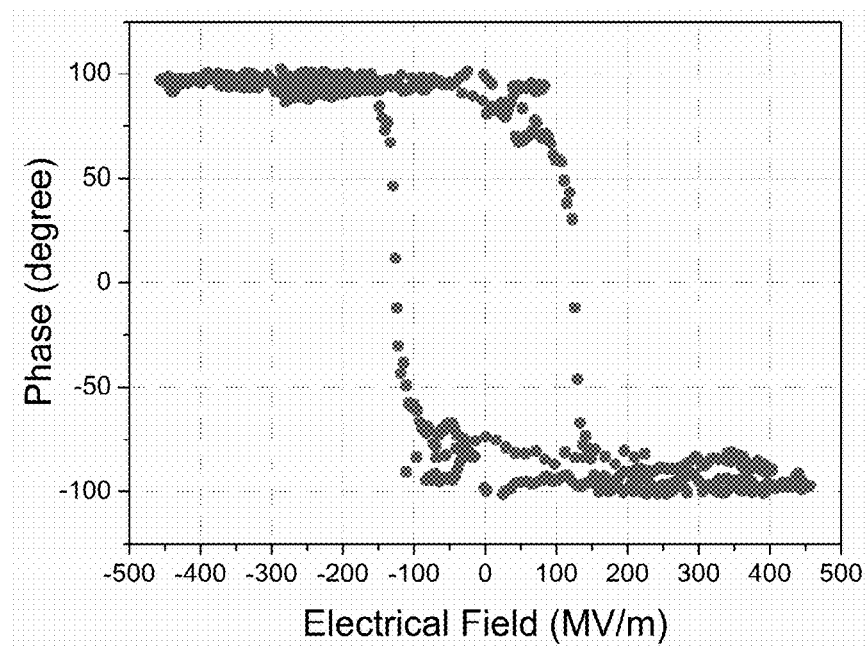
FIG. 4B shows phase response of the β-phase PVDF.

The hysteresis loop of phase versus electrical field from the β-phase PVDF is presented in FIG. 4B and shows the phase changing from ~90° to ~−90° under the bipolar excitation voltage, which can be interpreted as a result of switching the polarization direction of the thin film with the coercive field matching both the phase and strain loops. A large strain of up to 3% from the β-phase PVDF is observed from the butterfly loop shown in FIG. 4A and is comparable to irradiated PVDF copolymers with trifluoroethylene or irradiated P(VDF-TrFE), which are widely reported as high performance polymer actuators. A giant piezoelectric strain coefficient $d_{33}$ of up to −71.84±1.73 pm/V is calculated from FIG. 4A. This giant $d_{33}$ value corresponds to the large aligned dipole domains induced by large β-phase content in this dehydrofluorinated PVDF that has been proved through the characterizations above. Remarkably, this $d_{33}$ value is larger than any other reported $d_{33}$ values for PVDF and PVDF copolymers devices. Therefore, the present invention is an excellent candidate for energy harvesting, sensing and actuating devices because of its superior properties over existing PVDF based polymers.

A high strain level is not convincing enough for evaluating an actuator material, especially for soft polymers because the Maxwell stress effect generated by the Coulomb force between accumulated charges may also induce a high strain to the soft material. Therefore, other parameters including strain energy density are also important in evaluating actuator materials. Here, we evaluate the strain energy density of dehydrofluorinated PVDF in terms of volumetric energy density, which is proportional to $E\varepsilon^2/2$, and gravimetric energy density, which is proportional to $E\varepsilon^2/2\rho$, where E is the Young's modulus, ε is the generated strain level and ρ is the density of the material.

To calculate the strain energy density, a Young's modulus (E) of 2.51±0.05 GPa is used as measured from the dehydrofluorinated PVDF through a tensile measurement following the ASTM D882 standard, and a strain level (ε) of 3% is used as obtained from the PFM measurement discussed previously. The results are compared with several previously reported actuator materials in Table 1 below, including a traditional piezoceramic material lead-zinc titanate (PZT), a piezoelectric single crystal lead-zinc-niobate/lead titanate (PZN-PT), a silicone dielectric elastomer, and a P(VDF-TrFE) electrostrictor.

TABLE 1

Young's modulus, strain and strain energy density (volumetric and gravimetric) of dehydrofluorinated PVDF and other materials.

| Material | E (GPa) | Strain (ε) | $E\varepsilon^2/2$ (J/cm³) | $E\varepsilon^2/2\rho$ (J/kg) |
| --- | --- | --- | --- | --- |
| Piezoceramic (PZT) | 7.5 | 0.15% | 0.008 | 1.1 |
| Single crystal PZN-PT | 7.7 | 1.7% | 1.11 | 146 |
| Silicone dielectric elastomer | 0.01 | 25% | 0.31 | 135 |
| P(VDF-TrFE) electrostrictor | 0.38 | 4% | 0.3 | 160 |
| Dehydrofluorinated PVDF actuator | 2.5 | 3% | 1.13 | 632 |

| Material | E (GPa) | Strain (ε) | $E\varepsilon^2/2$ (kJ/m³) | $E\varepsilon^2/2\rho$ (J/kg) |
| --- | --- | --- | --- | --- |
| Human skeleton muscle | 0.06 | 25% | 1750 | 1573 |
| Piezoceramic (PZT) | 7.5 | 0.15% | 8.4 | 1.1 |
| Single crystal PZN-PT | 7.7 | 1.7% | 1113 | 146 |
| Silicone dielectric elastomer | 0.01 | 25% | 313 | 135 |

TABLE 1-continued

Young's modulus, strain and strain energy density (volumetric and gravimetric) of dehydrofluorinated PVDF and other materials.

| | | | | |
| --- | --- | --- | --- | --- |
| Shape memory alloy (Nitinol) | 28 | 5% | 35000 | 5426.4 |
| P(VDF-TrFE) electrostrictor | 0.38 | 4% | 304 | 160 |
| Dehydrofluorinated PVDF actuator | 2.5 | 3% | 1125 | 632 |

The comparison shows that the present invention exhibits superior volumetric and gravimetric strain energy density surpassing all other actuator materials. The low density and high modulus features of the present invention lead to a gravimetric strain energy density more than three times higher than that of previous reported electron-irradiated P(VDF-TrFE), meanwhile providing better mechanical properties in actuator designing. It's conclusive that the reported dehydrofluorinated PVDF that generates giant piezoelectric strain with ultrahigh strain energy density is an excellent candidate for high performance actuator applications.

These results demonstrate that the present invention has significantly improved ferroelectric and piezoelectric properties when compared to previously reported PVDF and its trifluoroethylene copolymers. The FTIR and XRD characterization results suggest that the developed controllable dehydrofluorination method leads to a very high β phase PVDF by largely increasing the effective dipoles contained in the polymer. Excellent ferroelectricity with a remnant polarization of 6.30±0.10 µC/cm² and coercive field of 105 MV/m is determined from the dehydrofluorination induced β phase PVDF. Meanwhile, a never reported giant piezoelectric strain coefficient ($d_{33}$) of −71.84±1.73 pm/V is obtained from PFM testing. Due to the large content of β phase, the large increase of polarization in the dehydrofluorination induced β phase PVDF generates giant piezoelectric strain of up to 3% with a very high strain energy density. Such results show that the present invention is a worthwhile candidate for biomimetic actuators and artificial muscle technologies.

There are abundant uses for materials with ferroelectric (ability to maintain an electric dipole) and piezoelectric (ability to produce an electric charge from external stress) properties. Such materials can be used as sensors, actuators, memory switches, and energy harvesters, among others. As of now, industries using piezoelectric materials frequently employ lead-based ceramics, and there are desires to produce these materials from polymers due to their easier processing, cheaper costs, and lower toxicity. Additionally, piezoelectric polymers have the ability to be incorporated onto flexible electronics and textiles. Polyvinylidene fluoride (PVDF) contains these characteristics when it crystallizes in its beta phase.

Example 1

Poly (vinylidene Fluoride) (PVDF) (Kynar 301F) was dissolved in N, N-dimethylformamide (DMF) (BDH, ACS, 99.8%) at room temperature with a concentration of 7 wt. %. Ethylene diamine (ACROS Organics, 99+% extra pure) was added to the prepared PVDF/DMF solution with a concentration of 2 wt. %. The mixture was then placed in a sonicator bath for 30 minutes to achieve uniform solution. After thorough mixing, the solution was maintained at room temperature under ambient atmosphere (room temperature in air at atmospheric pressure) for 8-10 hours. Stirring was used to guarantee the reaction proceeding uniformly within the solution, but was unnecessary for a small volume reaction (solution volume less than 100 ml). After the reaction finished, the solution was poured into deionized water to make the product precipitate from the solution. The product was collected by vacuum assisted filtration after totally precipitation in water. Then the product was washed with deionized water and filtered several times until the filtrate had a neutral pH. The product is finally dried in a convection oven at 80° C. under ambient atmosphere.

Example 2

Poly (vinylidene Fluoride) (PVDF) (Kynar 301 F) was dissolved in N, N-dimethylformamide (DMF) (BDH, ACS, 99.8%) at room temperature with a concentration of 7 wt. %. Ethylene diamine (ACROS Organics, 99+% extra pure) was added to the prepared PVDF/DMF solution with a concentration of 2 wt. %. The mixture is then kept stirring at room temperature under ambient atmosphere (room temperature in air at atmospheric pressure) for 8 hours. The solution was poured into deionized water after reaction was finished to separate the product. The product PVDf was collected and washed with deionized water and then dried in a convection oven at 80° C. under ambient atmosphere. After completely dried, the product PVDF was dissolved in DMF again at room temperature with a concentration of 20 wt. %. The solution was casted on to a glass substrate and dried a oven at 80° C. under vacuum to produce a PVDF film with a thickness of ~100 μm. The film was gripped on an Instron universal load frame (Model 5982) and stretched uniaxially with a rate of 10 mm/min at 120° C. The product film was eventually stretched by a elongation of 300%. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for synthesizing a piezoelectric material comprising a β-phase of a fluoropolymer, the method comprising:
    dissolving a starting fluoropolymer comprising poly (vinylidene fluoride) (PVDF) or a copolymer of vinylidene fluoride (VDF) in a solvent with a base;
    reacting the base and the starting fluoropolymer for a time sufficient to dehydrofluorinate the fluoropolymer to an extent equivalent to reacting a solution containing 7 wt. % poly (vinylidene fluoride) (PVDF) in N,N-dimethylformamide (DMF) and 2 wt. % ethylene diamine (EDA) for from about 4 hours to about 8 hours at room temperature and form a reaction mixture comprising a dehydrofluorinated fluoropolymer;
    recovering the dehydrofluorinated fluoropolymer as a solid from the reaction mixture to form the piezoelectric material, the piezoelectric material having a higher content of β-phase than the starting fluoropolymer and measurable piezoelectric properties; and
    having the piezoelectric material incorporated into a piezoelectric device.
2. The method according to claim 1, wherein the base is a weak organic base.
3. The method according to claim 1, wherein the base is selected from $C_{1-6}$ monoamines and $C_{1-6}$ diamines.
4. The method according to claim 1, wherein the solution comprises a solvent selected from the group consisting of N-methyl pyrrolidone (NMP), dimethylsulfoxide (DMSO), N,N-dimethylformamide (DMF), methyl ethyl ketone (MEK), tetrahydrofuran (THF), and N,N-dimethyl acetamide (DMAc).
5. The method according to claim 1, wherein the starting fluoropolymer comprises poly (vinylidene fluoride) (PVDF).
6. The method according to claim 1, wherein the starting fluoropolymer comprises a copolymer or terpolymer of vinylidene fluoride (VDF) and trifluoroethylene (TrFE).
7. The method according to claim 1, wherein the starting fluoropolymer comprises a copolymer of vinylidene fluoride (VDF), trifluoroethylene (TrFE), and either hexafluoropropylene (HFP) or chlorotrifluoroethylene (CTFE).
8. The method according to claim 1, comprising recovering the dehydrofluorinated fluoropolymer as a solid from the reaction mixture by casting the reaction mixture and removing the solvent from the solution.
9. The method according to claim 1, comprising precipitating the solid dehydrofluorinated fluoropolymer from the solution.
10. A method for making a piezoelectric solid polymer material comprising:
    reacting a starting polymer comprising poly (vinylidene fluoride) (PVDF) or a copolymer of vinylidene fluoride (VDF) in a solution with an organic base to dehydrofluorinate the starting polymer to an extent equivalent to reacting a solution containing 7 wt. % poly (vinylidene fluoride) (PVDF) in N,N-dimethylformamide (DMF) and 2 wt. % ethylene diamine (EDA) for from about 4 hours to about 8 hours at room temperature to make a polymeric reaction product;
    recovering the polymeric reaction product from the solution; and
    having the dehydrofluorinated fluoropolymer incorporated into a piezoelectric device as a piezoelectric material,
    wherein the starting polymer is poly (vinylidene fluoride) (PVDF) or a copolymer of vinylidene fluoride (VDF); and
    wherein the polymeric reaction product recovered from the solution is the piezoelectric solid polymer material, which can be solubilized in N,N-dimethylformamide (DMF) and casted into a film characterized by a piezoelectric strain coefficient $d_{33}$ more negative than −25 pm/V.
11. The method according to claim 10, wherein the starting polymer comprises poly (vinylidene fluoride) (PVDF).
12. The method according to claim 10, wherein the starting polymer comprises a copolymer of vinylidene fluoride (VDF) and trifluoroethylene (TrFE).
13. The method according to claim 10, wherein the starting polymer is a copolymer of vinylidene fluoride (VDF), trifluoroethylene (TrFE), and either hexafluoropropylene (HFP) or chlorotrifluoroethylene (CTFE).
14. The method according to claim 10, comprising drawing the polymeric reaction product.
15. The method according to claim 14, wherein drawing further increases beta phase content of the reaction product.
16. The method according to claim 10, wherein the polymeric reaction product is not drawn to make a piezoelectric β-phase.

17. The method according to claim 10, comprising reacting at a temperature of 10° C. to 40° C.

18. The method according to claim 10, comprising reacting at a temperature of 20° C. to 30° C.

19. The method according to claim 10, wherein the polymeric reaction product recovered from the solution is characterized by a piezoelectric strain coefficient $d_{33}$ more negative than −35 pm/V.

20. The method according to claim 10, wherein the polymeric reaction product recovered from the solution is characterized by a piezoelectric strain coefficient $d_{33}$ in the range of 30 pm/V to 100 pm/V.

21. A method for making a stable β-phase poly (vinylidene fluoride) (PVDF), comprising:

reacting poly (vinylidene fluoride) (PVDF) in a solvent with an organic base to dehydrofluorinate the poly (vinylidene fluoride) (PVDF) to an extent equivalent to reacting a solution containing 7 wt. % poly (vinylidene fluoride) (PVDF) in N,N-dimethylformamide (DMF) and 2 wt. % ethylene diamine (EDA) for from about 4 hours to about 8 hours at room temperature, the organic base being a primary amine, a secondary amine, a monoamine, or a diamine;

recovering the stable β-phase poly (vinylidene fluoride) (PVDF) from the solution; and having the stable β-phase poly (vinylidene fluoride) (PVDF) incorporated into a piezoelectric device as a piezoelectric material, wherein the stable β-phase poly (vinylidene fluoride) (PVDF) can be solubilized in N,N-dimethylformamide (DMF) and casted into a film characterized by a piezoelectric strain coefficient $d_{33}$ more negative than −25 pm/V.

22. The method according to claim 1, wherein the piezoelectric material recovered from the reaction mixture can be casted into a film characterized by a piezoelectric strain coefficient $d_{33}$ more negative than −25 pm/V.

23. The method according to claim 1, wherein the piezoelectric device is selected from the group consisting of sensors, actuators, transducers, memory switches, energy harvesters, micro-fluid systems, artificial muscles, and textiles.

* * * * *